United States Patent
Drapkin et al.

(10) Patent No.: US 6,429,716 B1
(45) Date of Patent: Aug. 6, 2002

(54) PRE-BUFFER VOLTAGE LEVEL SHIFTING CIRCUIT AND METHOD

(75) Inventors: Oleg Drapkin, North York; Grigori Temkine, Toronto, both of (CA)

(73) Assignee: ATI International SRL, Barbados (KN)

( * ) Notice: Subject to any disclaimer, the term of this patent is extended or adjusted under 35 U.S.C. 154(b) by 0 days.

(21) Appl. No.: 09/211,496

(22) Filed: Dec. 14, 1998

(51) Int. Cl.[7] .................................................. H03L 5/00
(52) U.S. Cl. ........................ 327/333; 327/66; 323/313; 326/63; 326/80
(58) Field of Search ............................ 327/53, 66, 333, 327/198, 199; 326/68, 63, 80, 82; 323/312, 313, 315

(56) References Cited

U.S. PATENT DOCUMENTS

| | | | | |
|---|---|---|---|---|
| 4,604,533 A | * | 8/1986 | Miyamoto et al. | 327/66 |
| 4,987,379 A | * | 1/1991 | Hughes | 330/253 |
| 5,200,710 A | * | 4/1993 | Kato | 327/53 |
| 5,237,212 A | * | 8/1993 | Maekawa | 327/333 |
| 5,642,062 A | * | 6/1997 | Kawakami | 327/66 |
| 5,789,948 A | * | 8/1998 | Kim et al. | 327/55 |
| 5,801,553 A | * | 9/1998 | Danstrom | 327/66 |

OTHER PUBLICATIONS

A.G.P. Design Guide: Covering 1X, 2X, and 4X Modes and 1.5 Volt and 3.3 Volt Signaling (Revision 1.0, Intel Corporation, Aug. 1998).

Accelerated Graphics Port Interface Specification (Revision 2.0, Intel Corporation, May 4, 1998).

* cited by examiner

Primary Examiner—Timothy P. Callahan
Assistant Examiner—An T. Luu
(74) Attorney, Agent, or Firm—Vedder, Price, Kaufman & Kammholz

(57) ABSTRACT

A pre-buffer voltage level shifting circuit includes a multi-supply voltage level shifting circuit having single gate oxide devices coupled to produce a pre-buffer output signal to an output buffer. The pre-buffer output signal has a level within normal gate voltage operating levels of the single gate oxide devices for each of the least a plurality of supply voltages. In one embodiment, the multi-supply voltage level shifting circuit includes a current mirror coupled to at least one of the first or second power supply voltage and also uses a non-linear device, such as a transistor configured as a diode, which is coupled to the output of current mirror. The non-linear device is coupled to receive a digital input signal from a signal source, such as from a section of core logic. A switching circuit coupled to the non-linear device selectively activates the non-linear device based on a level of the digital input signal. The circuit, in effect, shifts the core logic supply voltage up to provide efficient and safe control of single oxide gate output buffer transistor devices, such as p-channel devices.

18 Claims, 7 Drawing Sheets

PRE-BUFFER VOLTAGE LEVEL SHIFTING CIRCUIT AND METHOD

RELATED CO-PENDING APPLICATIONS

This is a related application to the following co-pending applications, filed on even date, having the same inventors and assigned to instant assignee:

1. Single Gate Oxide Differential Receiver and Method, having Ser. No. 09/211,469;
2. Voltage Supply Discriminator and Method, having Ser. No. 09/211,115; and
3. Differential Input Receiver and Method for Reducing Noise, having Ser. No. 09/210,969.

FIELD OF THE INVENTION

The invention relates generally to devices that may use a number of different voltage supply levels, and more particularly to systems and methods for allowing input/output buffers to suitably operate using different voltage supply levels.

BACKGROUND OF THE INVENTION

Graphics controller chips, like many integrated circuit devices, utilize CMOS, logic cores, and associated input/output (I/O) pads as part of their circuit makeup. I/O pads include, for example, input/output buffers coupled to a common pad or pin. There is a constant challenge to continuously design smaller, faster and more complicated integrated circuits to provide increased functionality for multimedia applications and other applications. Typically, the logic core operates at a different supply voltage than the I/O pads. For example, with logic cores having minimum gate lengths of 0.25 um and gate oxide thicknesses of 50 angstroms, a core logic supply voltage may be 2.5 volts. Corresponding supply voltages for the input/output pads, however, may be different supply voltages such as 3.3 volts. However, future generation chips require faster speeds and lower power consumption, hence, lower supply voltages so that the I/O pads can switch at faster frequencies.

Also, integrated circuits must often provide compatibility with older versions of interface circuits. As a result, an integrated circuit may require that the I/O pads operate at either a 3.3 volt level, or for example, at a lower 1.5 volt level. The gate length and gate oxide thickness of I/O pad transistors must also typically be decreased to provide faster circuits that draw less current. With multilevel supply voltages, multi-gate oxide thickness devices are often used to provide the requisite logic levels and overvoltage protection. However, a problem arises when multi-gate oxide transistors are used on the same chip. Using differing gate thickness' requires additional fabrication processes and, hence, results in higher fabrication costs. Moreover, the larger gate oxide thickness can slow the device down unnecessarily. For low voltage CMOS signaling, the input/output pad must also be designed to prevent static leakage and prevent damage due to gate-source or gate-drain overvoltage.

FIG. 1a shows a block diagram of a conventional I/O pad 10 including an output buffer 12 and an input buffer 14 coupled to a common pad or pin 16. The I/O pad 10 communicates signals to and from the pad 16 for the core logic 18. As shown in FIG. 1b, one known solution for preventing gate-source over voltage and reducing static leakage for an output buffer of an I/O pad is to use thick gate MOSFETS indicated as transistors 20a and 20b. As shown, pmos transistor 20a and nmos transistor 20b are configured as thick gate oxide devices having approximately a 70 angstrom gate oxide. The output buffer includes pre-buffers 22a and 22b which allow an output signal on the pad to be a logic "1" or a "0" depending upon which MOSFET is activated. As shown, the supply voltage to the buffer may be, for example, 3.3 volts or 1.5 volts. Hence, these. configurations can accommodate different I/O pad supply voltages. However, a problem with the structure of FIG. 1b is that the thick gate oxide transistor has to become too large to accommodate a 1.5 volt supply voltage to provide enough current and speed. Increasing the size of the thick gate devices will then increase the parasitic capacitance and slow down the operation of the device. It is desirable to reduce the gate oxide thickness and gate length to speed up the operation and reduce power consumption. As such, FIG. 1c shows a conventional design that employs a thin gate nmos cascade arrangement using nmos transistors 24a and 24b in conjunction with a thick gate pmos transistor 20a. The structure of FIG. 1c utilizes the cascading of the thin gate nmos devices such as thin gate oxide devices to prevent over voltage degradation to each of the respective thin gate devices. Voltages should be within normal operating voltages across junctions. However, this requires the use of a thick gate pmos device resulting in the use of several different gate oxide thickness technologies on the same I/O pad. The use of differing gate oxide technologies on the same chip can result in increased fabrication costs.

Consequently, a need exists for an I/O pad that can accommodate multiple source voltages using single gate oxide devices. It would be desirable to have an input/output pad containing I/O buffers that can handle different supply voltages while also reducing the cost of fabrication and improve operational speed.

DETAILED DESCRIPTION OF A PREFERRED EMBODIMENT OF THE INVENTION

Briefly, a buffer circuit utilizes a pre-buffer voltage level shifting circuit on, for example, an output buffer of an I/O pad to accommodate different I/O pad supply voltages while maintaining normal operating voltages (degradation levels) across junctions of single gate oxide devices that form the buffer. As structured, the single gate oxide output buffer can operate at several different supply voltages.

A pre-buffer voltage level shifting circuit includes a multi-supply voltage level shifting circuit having single gate oxide devices coupled to produce a pre-buffer output signal to an output buffer. It will be recognized that the term pre-buffer and buffer as used herein may be used interchangeably since a buffer may be defined to include the pre-buffer circuitry. The pre-buffer output signal has a level within normal gate voltage operating levels of the single gate oxide devices for each of the least a plurality of supply voltages. In one embodiment, the multi-supply voltage level shifting circuit includes a current mirror coupled to at least the first or second power supply voltage and also uses a non-linear device, such as a transistor configured as a diode, which is coupled to the output of current mirror. The non-linear device is coupled to receive a digital input signal from a signal source, such as from a section of core logic. A switching circuit coupled to the non-linear device selectively activates the non-linear device based on a level of the digital input signal. The circuit, in effect, shifts the core logic supply voltage up to provide efficient and safe control of single oxide gate output buffer transistor devices, such as p-channel devices. The non-linear device provides the voltage shift. To support another supply voltage level, such as 1.5 volt, a multi-mode bypass circuit is used. A reference voltage generator is coupled to limit the voltage level of an output buffer MOSFET transistor to facilitate multi-supply voltage level shifting in response to the use of one of the supply voltage levels. The multi-mode bypass circuit facilitates bypassing of the non-linear device in response to differing supply voltages.

The level shifting circuit converts, for example, a 0 to 2.5 volt input into a 1 volt to 3.3 volt output swing where a 3.3 volt supply is used, and a 0 to 1.5 volt swing for a 1.5 volt supply voltage. As such, the disclose circuit and method allows for the supporting of safe control of single thin gate oxide devices for a multitude of supply voltages.

Figure 1A:
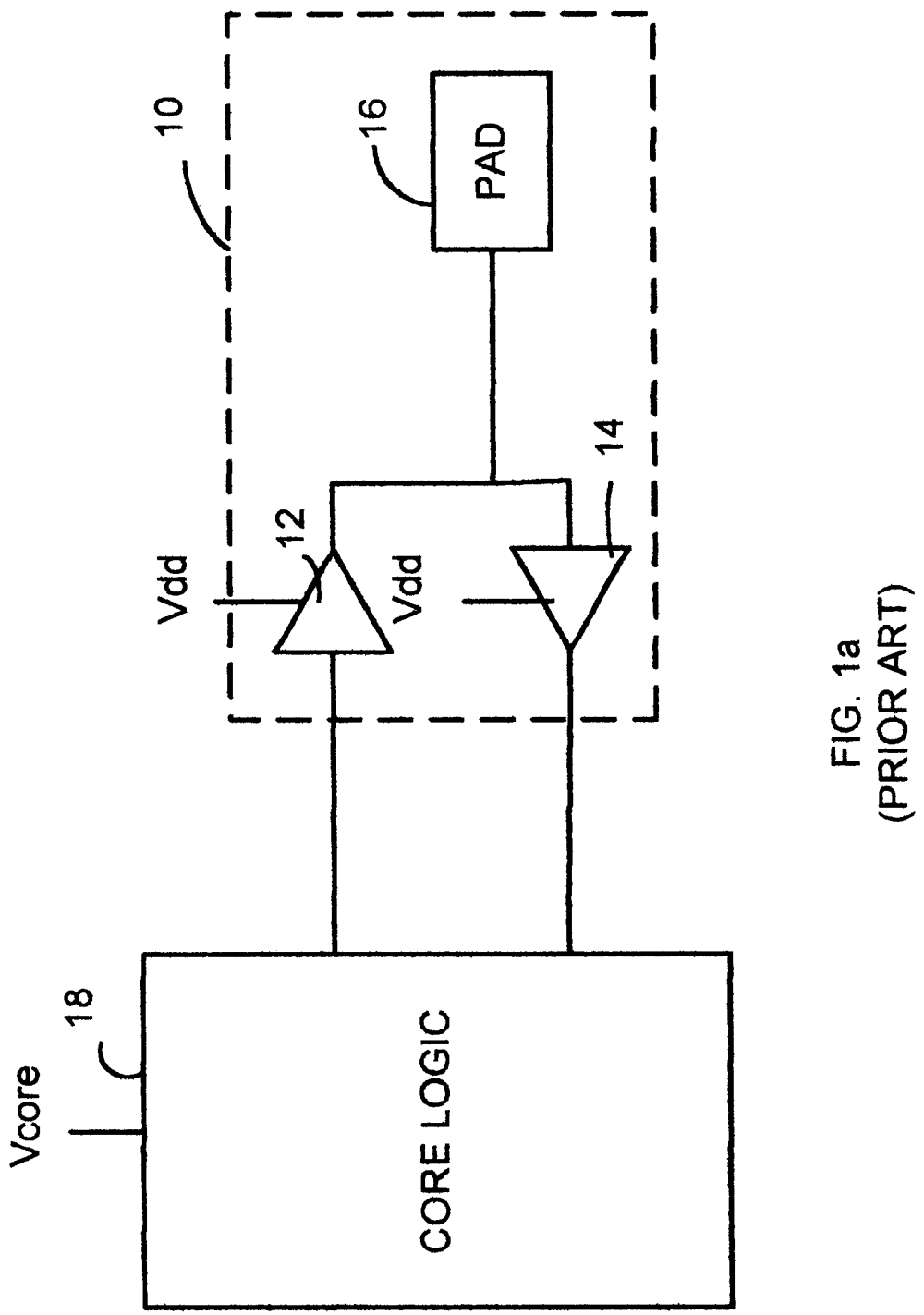
FIG. 1a is a block diagram of a prior art I/O pad and associated logic.
Figure 1C:
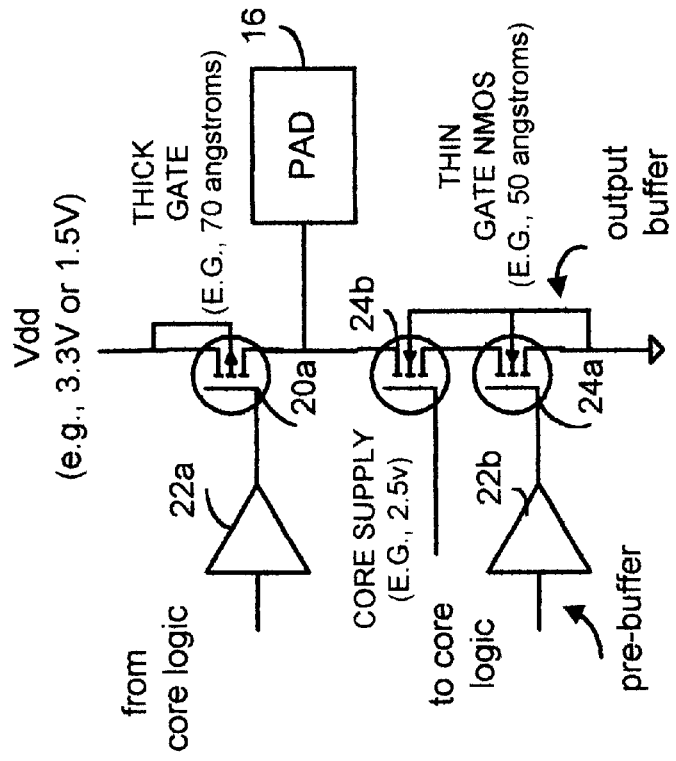
FIG. 1c illustrates a circuit diagram of another embodiment of prior art output buffer.
Figure 1B:
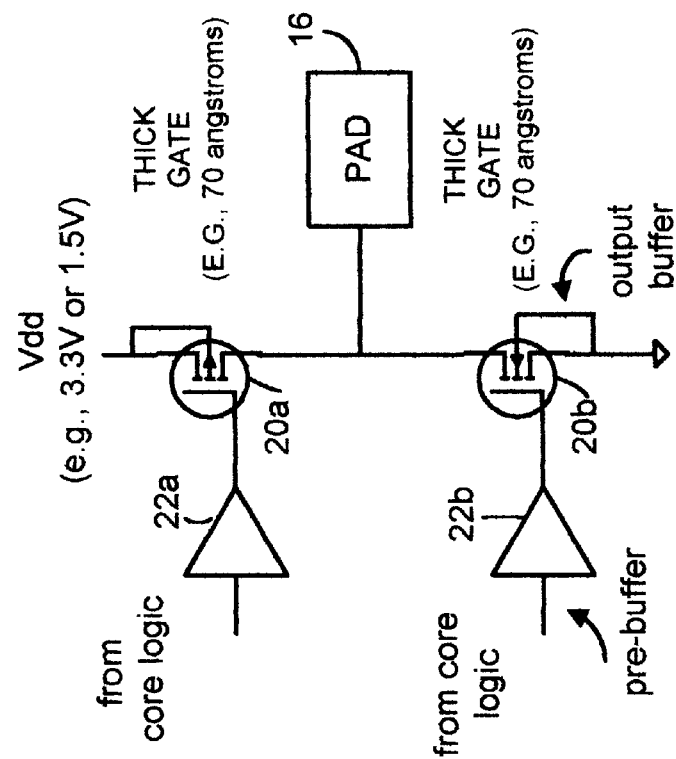
FIG. 1b is one example of a prior art output buffer.
Figure 2:
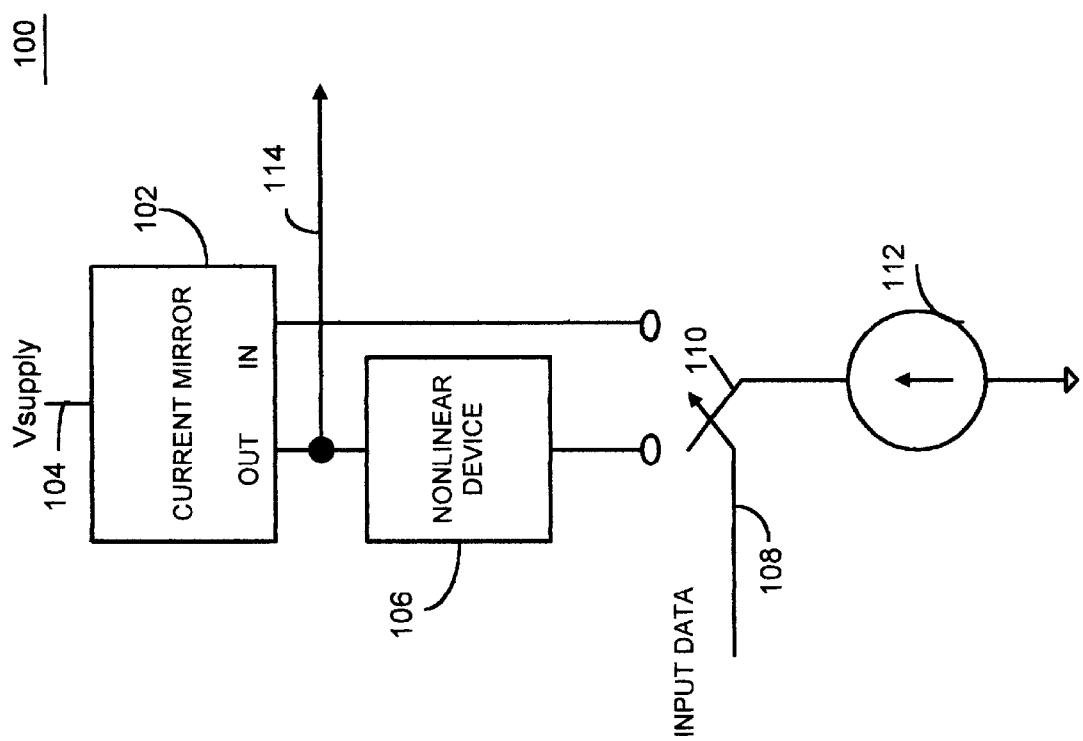
FIG. 2 illustrates a block diagram of one embodiment of the invention.

FIG. 2 shows one embodiment of the pre-buffer voltage level shifting circuit 100 having a current mirror 102 receiving a supply voltage 104 that may be changed to a second supply voltage depending upon the application. The pre-buffer voltage level shifting circuit 100 also includes a non-linear device 106 with a diode voltage to current characteristic which is coupled to the output of the current mirror 102. Digital input 108 as generated by a data source, such as core logic, activates a switch 110 to switch a current source 112 to drive the current mirror 102. The digital input signal also causes the current mirror to "float" when the non-linear device is switched out of the circuit. The current mirror allows the pre-buffer voltage level shifting circuit to drive the pre-buffer output signal 114 to the rail of the supply voltage 104. The non-linear device 106 effectively clamps the output voltage of the pre-buffer output signal to a level, such as 0.8 to 1 volt, which is high enough for a particular voltage supply level to prevent voltages from exceeding normal operating ranges for an output transistor in a final buffer stage.

Figure 3:
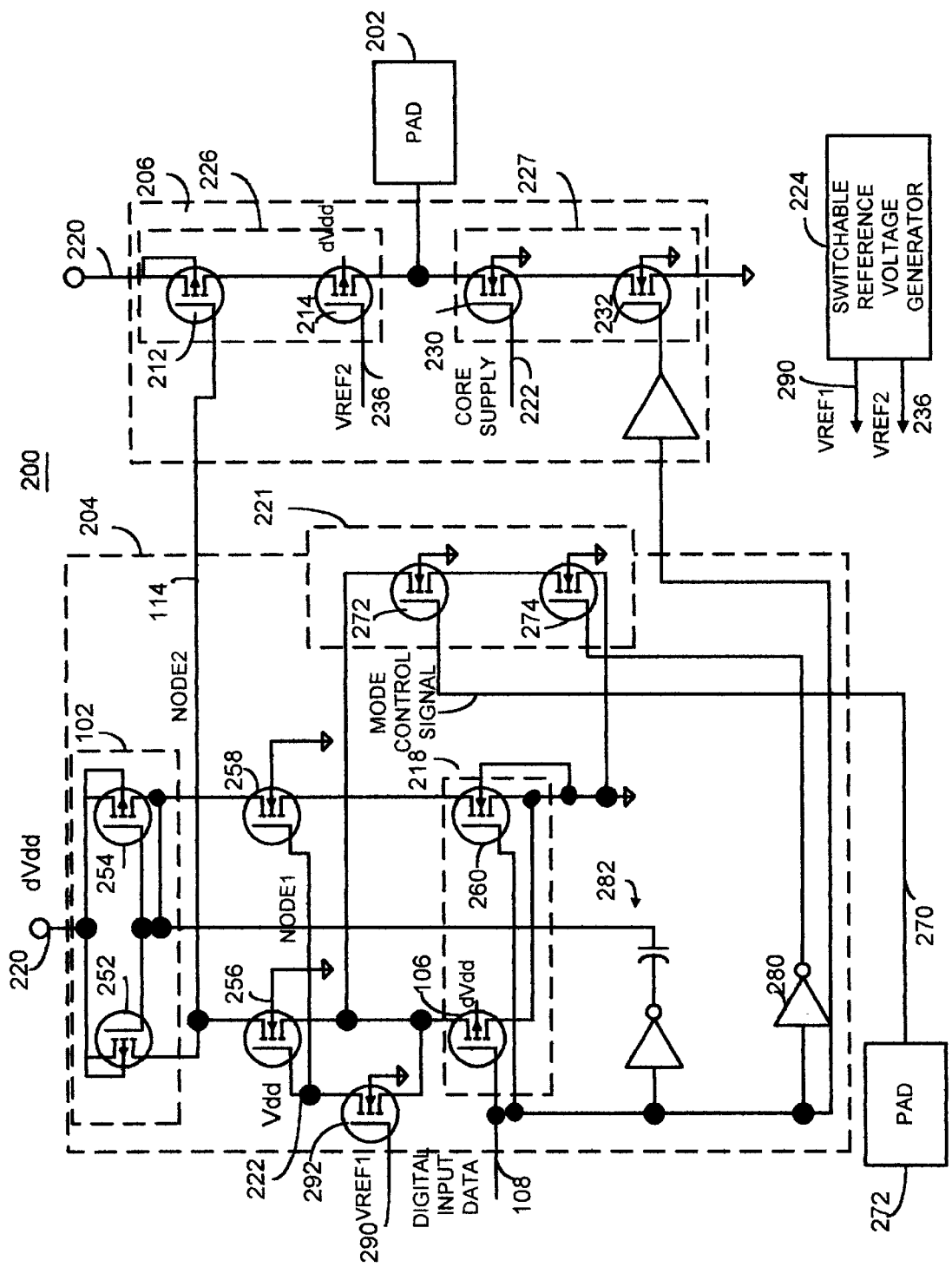
FIG. 3 is a schematic illustration of one embodiment of an output buffer with a voltage level shifting circuit in accordance with one embodiment of the invention.

FIG. 3 shows one example of a buffer, such as an output buffer 200 coupled to a pad or pin 202. The output buffer 200 and pad 202 may be part of an I/O pad. The output buffer 200 includes an example of the circuit 100 in the form a pre-buffer circuit and output buffer circuit 206. The pre-buffer circuit serves as a multi-supply voltage level shifting circuit 204 having single gate oxide devices coupled to produce the pre-buffer output signal 114 to the output buffer 206. The pre-buffer output signal 114 has a level within normal operating voltage levels of the single gate oxide devices 212 and 214 for each of at least two different supply voltages.

The multi-supply voltage level shifting circuit 204 includes the non-linear device 106, a switching circuit 218, a multi-mode bypass circuit 220 and a switchable reference voltage generator 224. The supply voltage 220 may be, for example, 3.3 volts, 1.5 volts, or any other suitable supply voltage levels. A core supply voltage level 222, such as 2.5 volts or other suitable voltage level is also used in the output buffer 200.

The main buffer 206 includes a pair of cascaded pmos transistors 226 and a pair of nmos transistors 227 serially coupled as shown. The reference voltage generator 224 is coupled to an output buffer transistor 214 to facilitate multi-supply voltage level shifting in response to the use of one of the multiple supply voltages by providing a reference voltage high enough to provide normal operating voltage levels for the gate for pmos transistor 214. The single gate oxide devices shown all have the same gate oxide thickness, such as 50 angstroms or less. They are preferably FETs made of dioxide silicon but may be any suitable device or any suitable gate oxide.

The serially coupled single gate oxide cascaded pmos pair 226 includes pmos transistors 212 and 214. The nmos transistor pair 227 includes nmos transistors 230 and 232 coupled as shown. A gate of the pmos transistor 212 receives the pre-buffer output signal 114 and a source is coupled to the supply voltage 220. The drain is coupled to the source of the pmos transistor 214 and the gate of the pmos transistor is coupled to receive the reference voltage 236 generated by the reference generator 224. The reference voltage (V ref 2) serves to provide a pmos voltage level high enough for the single gate oxide gate-drain junction to operate in its normal operating voltage range to prevent degradation when the 3.3 volt supply is used.

The current mirror 102 includes a plurality of single gate oxide pmos transistors 252 and 254 configured as a current mirror wherein a source of each pmos transistor is coupled to the supply voltage 220 which may be one of a plurality supply voltages. Each of the gates of the pmos transistors 252 and 254 are coupled to each of a plurality of single gate oxide nmos transistor 258 which gate is configured to receive a supply voltage from a core logic voltage source or other suitable voltage source 222.

In this embodiment, the non-linear device 106 includes an input single gate oxide pmos transistor having a gate coupled to receive the digital signal input from the core logic or other suitable source, and has its source coupled to a source of nmos transistor 256. However, any suitable non-linear device may used. As shown, the switching circuit 218 includes the non-linear device 106 as well as a single gate oxide switch such as nmos transistor 260. The nmos transistor 260 has its drain coupled to the source of nmos transistor 258. A multi-mode switching circuit 221 receives a mode control signal 270 from an external pad or pin 272 which may be tied, for example, to the supply voltage 220 or to the core supply voltage 222. The multi-mode switching circuit 221 includes a pair of cascaded single gate oxide nmos transistors 272 and 274 wherein a gate of nmos transistor 272 receives the mode control signal 270. A source of the nmos transistor 272 is coupled to the drain of nmos transistor 274. The source of the single gate oxide nmos transistor 274 is coupled to ground. The multi-mode switching circuit bypasses the non-linear device 106 when there is a lower source voltage, such as 1.5 volts serving as the supply voltage 220. As configured, and by way of example only, the mode control signal is tied to "0" volts when the source voltage is, for example, 3.3 volts and mode control signal is connected to 2.5 volts when the source voltage is a lower 1.5 volt supply voltage. An inverter 280 inverts the digital input data to drive the transistor 274 to operate as a switch 110 for a 1.5V voltage supply. Also shown as part of the pre-buffer multi-level shifting circuit is an inverter and capacitor 282 which is used if desired to force node 2 high faster.

As such, the pre-buffer voltage level shifting circuit shifts the digital input data level depending upon whether the supply voltage is 3.3 volts or 1.5 volts, for example. All devices shown are single gate oxide devices. With the single 50 angstroms or less gate oxide devices, it is incompatible to have a 3.3 volt drop between any gate/drain or gate/source since this would exceed the normal operating voltage of the device. Hence, the circuit operates to effectively shift the logic "0" level of the digital input data (the pre-buffer output signal) when the supply voltage is 3.3 volts so that the pre-buffer output signal range is about 3.3–1.0 volts. The multi-mode switching circuit 221 effectively bypasses the non-linear device 106 to provide) volts for a logic "0" level and 1.5V for a logic "1" level when the supply voltage is 1.5V.

Referring back to the buffer stage 206, the pmos transistor pair 212 and 214 act to switch the digital input data or transform a digital input data to a high logic level whereas the nmos pair 230 and 232 act to switch the digital input data to a low logic level for coupling with other circuitry converted to the pad or pin.

The switchable reference voltage generator 224 outputs a first reference voltage, such as 0.8–1 volt to the output pmos transistor 214 when the supply voltage is, for example, 3.3 volts. This insures that the operational voltage for pmos transistor 214 will not exceed a level that could degrade the device. A second reference voltage 290 drives transistor 292 to prevent noise influence that may be on the digital input signal from being passed through the non-linear device 106. The value of the second reference voltage 290 may be; for example, a threshold drop for a pmos device plus a voltage threshold drop for an nmos device. The reference voltage 290, in effect, prevents node 1 and node 2 from going to zero volts which could cause the output transistor 212 to exceed its gate-source operational voltage.

The switchable reference voltage generator 224 receives the control signal 270 to select which reference voltage is provided to the pmos transistor 214. If the supply voltage is 1.5 volts, for example, the nmos transistor 300 (FIG. 4) is turned on since the control signal value is set for 2.5 volts. This effectively provides zero volts as the reference voltage 236. If, however, the control signal indicates the 3.3 volt supply voltage, the mode signal is set at zero volts thereby activating pmos transistor 302 nmos transistor 310 and pmos transistor 312 to provide reference voltage 290 at about 1.6 volts (Vtn+Vtp). At the same time, the reference signal 236 is controlled to be approximately 0.8V–1.0V for the pmos transistor 214 through nmos transistor 304 and pmos transistor 306. Nmos transistor 308 serve to provide VREF1=0V to switch off nmos transistor 232 when the supply voltage is 1.5V.

Figure 4:
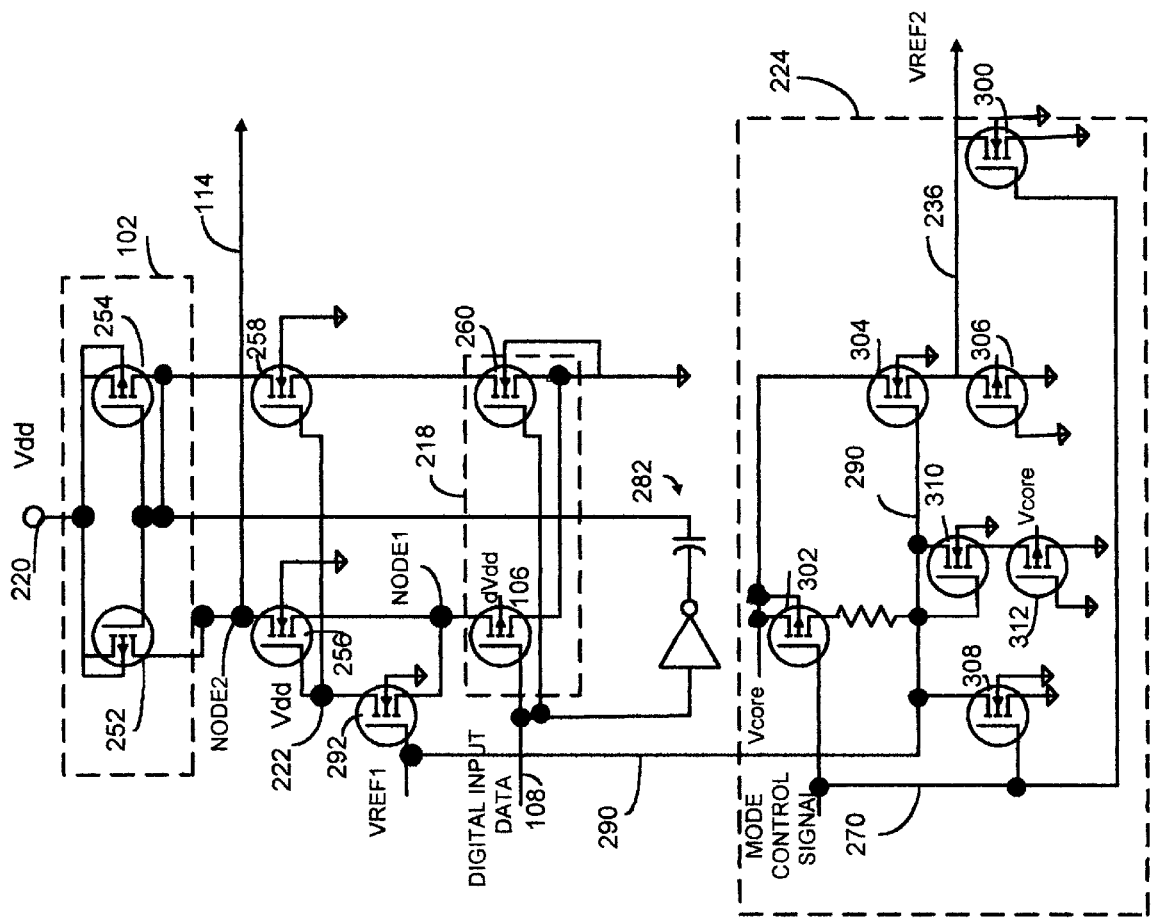
FIG. 4 is a circuit diagram illustrating one embodiment of voltage level shifting circuitry to accommodate a first supply voltage.

Referring to FIG. 4, the portion of the pre-buffer voltage level shifting circuit used when the supply voltage is, for example, 3.3 volts is shown. The pre-buffer output signal 114 in this arrangement has a 3.3 volt level corresponding to a logic "1" and approximately a 0.8V–1.0 V level corresponding to a logic "0". The 1 volt level is provided by the non-linear device 106 which effectively shifts the digital input data when it is in a logic "0" level to a 1 volt value due to the diode characteristics of the non-linear device. In operation, when the digital input data from the core is 2.5V, pmos transistor 106 is "off" and nmos transistor 260 is "on" to enable the current mirror 102 to provide node 2 with the potential equal to a potential of Vdd=3.3V when digital input data from the core is 0V. Conversely, the pmos transistor 106 is "on" and nmos transistor 260 is "off" to disable the current mirror 102 and to provide node 2 with the potential, equal to the potential of the source of pmos transistor 106 (about 0.8V–1.0V).

Figure 5:
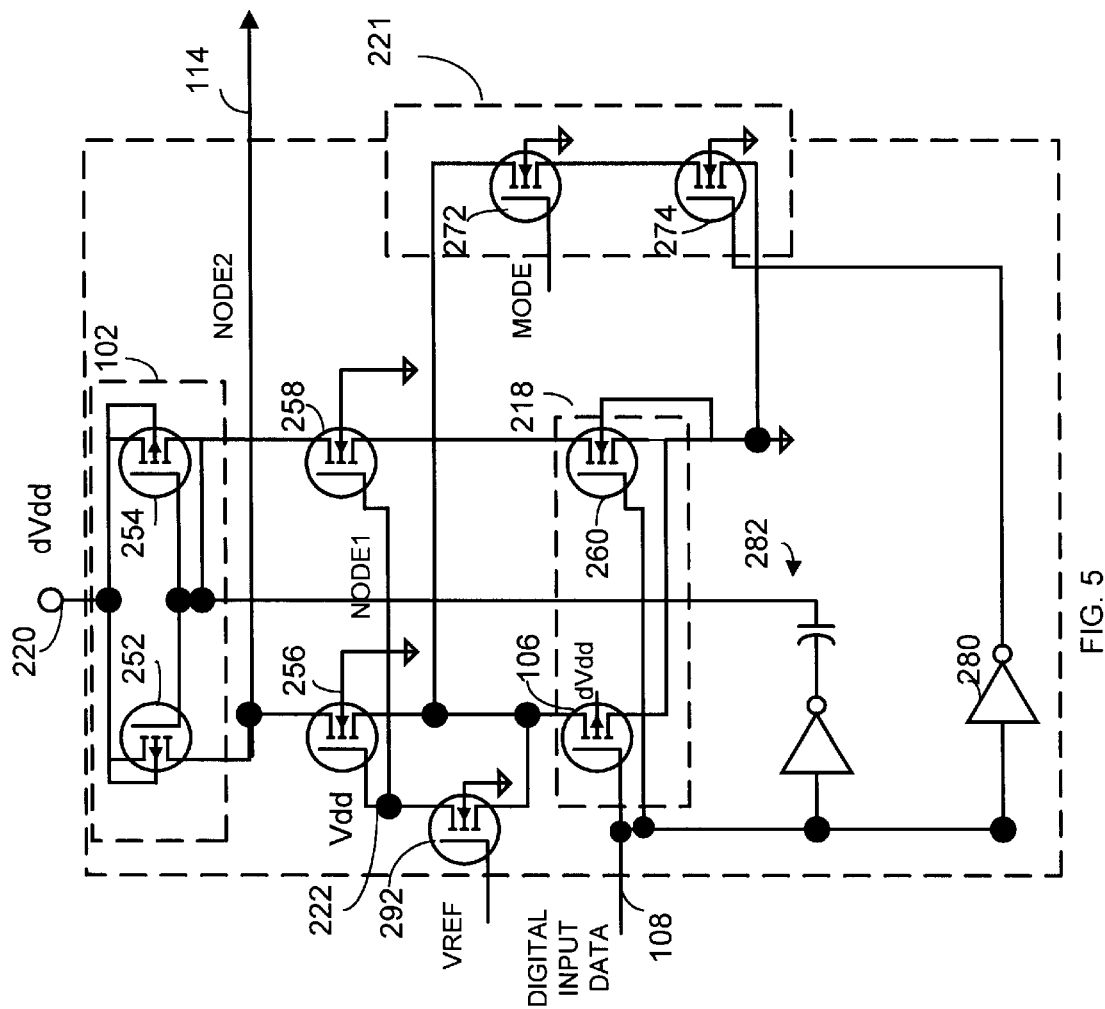
FIG. 5 is a schematic illustrating one embodiment of voltage level shifting circuitry used to accommodate a second supply voltage.

FIG. 5 illustrates the pre-buffer voltage level shifting circuit components generally utilized when a different supply voltage, such as a 1.5 volt supply voltage, is used. As shown, the multi-mode bypass circuit 221 is used to bypass the non-linear device 106 since there is no need for providing the shifted voltage level to the pmos transistor 212 when the output buffer supply voltage is only 1.5V. As such, the pre-buffer output signal 114 has a maximum of 1.5 V for a logic "1" or a 0 V for a logic "0".

In operation, when the digital input data form the core is 2.5V, pmos transistor 106 is "off," nmos transistor 274 is "off", and nmos transistor 260 is "on" to enable the current mirror 102 to provide node 2 with the potential equal to Vdd=1.5V. Conversely, when the digital input data is 0 volts, pmos transistor 108 is "on" as well as nmos transistor 272, and nmos transistor 260 is "of" to disable the current mirror 102. For a 1.5V input signal, nmos transistor 272 is "on" and together with nnmos transistor 274 they provide the potential of node 2 equal to zero volts.

Figure 6:
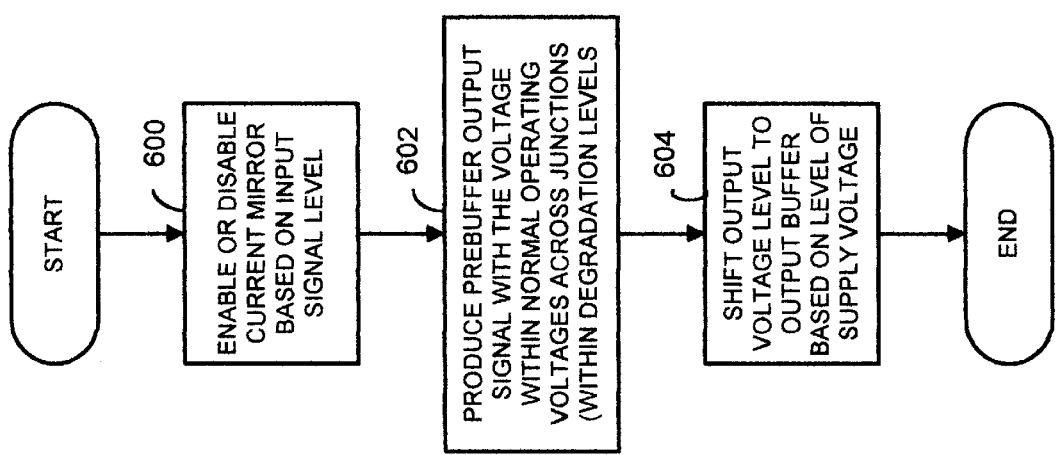
FIG. 6 is a flowchart illustrating a method for voltage level shifting in accordance with one embodiment of the invention.

Referring to FIG. 6, the system operates generally as shown in block 600 by enabling or disabling the current mirror based on the input signal level. As shown in block 602, the method includes producing a pre-buffer output signal with a level within the normal operating voltage range for a thin gate single gate oxide device, such as the pmos output transistor 212. As shown in block 604, the method includes shifting voltage levels to an output buffer in response to at least a first and second supply voltage using single gate oxide devices. Enabling the current mirror includes mirroring a current based on a reference voltage selected to limit a level within gate degradation levels of the single gate oxide devices. The pre-buffer output signal, based on a digital input signal from a digital source, is maintained within the degradation level based on a nonlinear operation of the nonlinear operated single gate oxide device. For higher voltage supplies (e.g., 3.3 volt) the circuit shifts the voltage level of the digital input data to the output buffer 206 based on the level of the supply voltage 220. For example, when the supply voltage is 3.3 volts, the "0" (low) logic level is shifted to about 1 V with the help of non-linear device 106, for example. However, when the supply voltage is 1.5 volts, the non-linear device 106 is effectively bypassed to provide )V for a logic "0" (low level).

It should be understood that the implementation of other variations and modifications of the invention in its various aspects will be apparent to those of ordinary skill in the art, and that the invention is not limited by the specific embodiments described. For example, it will be recognized that another suitable transistor types or configurations may also be used, if desired. It is therefore contemplated to cover by the present invention, any and all modifications, variations, or equivalents that fall within the spirit and scope of the basic underlying principles disclosed and claimed herein.

What is claimed is:

1. A pre-buffer voltage level shifting circuit operative with an output buffer comprising:
   a multi-supply voltage level shifting circuit, coupleable to at least one of a plurality of differing supply voltages, comprised of single gate oxide devices including a non-linear circuit and a multi-mode bypass circuit operatively coupled to produce a pre-buffer output signal to the output buffer wherein the pre-buffer output signal has a level within gate degradation levels of the single gate oxide devices for each of at least a first and second supply voltage;
   wherein the multi-supply voltage level shifting circuit includes a current mirror operatively coupled to at least one of the first and second supply voltages, and wherein the nonlinear device, is operatively coupled to an output of the current mirror circuit, having diode voltage/current characteristics and wherein the nonlinear device is coupled to receive a digital input signal from a signal source; and
   including a reference voltage controlled switch operatively coupled to limit a voltage level to an output buffer transistor to facilitate multi-supply voltage level shifting based on one of the first and second supply voltages.

2. The pre-buffer of claim 1 including a first switching circuit, operatively coupled to receive the digital input signal and operatively coupled to the current mirror and operative to switch based on a level of the digital input signal.

3. The pre-buffer of claim 2 wherein the nonlinear device serves as a second switching circuit.

4. The pre-buffer of claim 1 wherein the multi-mode bypass circuit is operatively coupled to facilitate bypassing of the non-linear device in response to whether the supply voltage is the first or second supply voltage.

5. The pre-buffer of claim 1 wherein the multi-supply voltage level shifting circuit includes only single gate oxide devices each having a gate thickness of 50 angstroms or less.

6. The pre-buffer of claim 1 wherein the first and second supply voltages are about 1.5 V and 3.3 V.

7. An input/output pad for an integrated circuit comprising:
   an output pre-buffer, operatively coupled to a digital signal source, having a multi-supply voltage level shifting circuit, coupleable to at least one of a plurality of differing supply voltages, comprised of single gate oxide devices including a non-linear circuit and a multi-mode bypass circuit operatively coupled to produce a pre-buffer output signal to the output buffer wherein the signal has a level within gate degradation levels of the single gate oxide devices for each of at least a first and second supply voltage wherein the multi-supply voltage level shifting circuit includes a current mirror operatively coupled to at least one of the one of the first and second supply voltages, and the nonlinear device, operatively coupled to an output of the current mirror circuit, having diode voltage/current characteristics and wherein the nonlinear device is coupled to receive a digital input signal from a signal source;
   an output buffer operatively coupled to the pre-buffer to receive the pre-buffer output signal;
   an I/O pad operatively coupled to the output buffer; and
   wherein the output buffer includes serially coupled single gate oxide cascaded nmos and pmos transistor pairs wherein a first gate of a first pmos transistor is operatively coupled to receive the pre-buffer output signal and a second gate of a second pmos transistor is operatively coupled to receive another reference voltage wherein the other reference voltage serves to provide the first gate with a pre-buffer output signal to a level within a gate degradation level of the first and second gates.

8. The I/O pad of claim 7 including a switching circuit operatively coupled to receive the digital input signal and operatively coupled to the current mirror and operative to switch based on a level of the digital input signal.

9. The I/O pad of claim 8 including a reference voltage controlled switch operatively coupled to limit a voltage level to an output buffer transistor in the output buffer, to facilitate multi-supply voltage level shifting based on the first and second supply voltages.

10. The I/O pad of claim 9 wherein the multi-mode bypass circuit is operatively coupled to facilitate bypassing of the non-linear device in response to whether the supply voltage is the first or second supply voltage.

11. The I/O pad of claim 10 wherein the multi-supply voltage level shifting circuit includes only single gate oxide devices each having a gate thickness of 50 angstroms or less.

12. The I/O pad of claim 11 wherein the first and second supply voltages are either one of at least 1.5 V and 3.3 V.

13. The I/O buffer of claim 12 wherein the nonlinear device serves as a switch in the switching circuit.

14. The I/O buffer of claim 7 wherein the current mirror includes a plurality of single gate oxide pmos transistors configured as a current mirror wherein a source of each pmos transistor is coupled to at least one of the first and second supply voltages and wherein the gates of each pmos transistor is operatively coupled to each of a plurality of single gate oxide nmos transistors configured to receive a reference voltage from a core logic voltage source.

15. The I/O buffer of claim 14 wherein the nonlinear device includes an input single gate oxide pmos transistor having a gate coupled to receive the digital signal and having a source operatively coupled to a drain of one of the single gate oxide nmos transistors configured to receive the reference voltage and wherein the switching circuit includes the input single gate oxide pmos transistor and a single gate oxide nmos transistor having a drain coupled to the drain of the input single gate oxide pmos transistor and to ground.

16. The I/O buffer of claim 15 wherein the multi-mode circuit includes a pair of cascaded single gate oxide nmos transistors configured such that a gate of a first single gate oxide nmos transistor receives a mode control signal and a drain of second single gate oxide nmos transistor is coupled to ground.

17. A pre-buffer voltage level shifting method comprising the steps of:

shifting voltage levels to an output buffer in response to at least one of a first and second supply voltage using single gate oxide devices;

producing a pre-buffer output signal to the output buffer wherein the signal has a level within gate degradation levels of the single gate oxide devices for each of the at least first and second supply voltages;

including the step of mirroring a current based on a reference voltage selected to limit a level within gate degradation levels of the single gate oxide devices wherein a pre-buffer output signal, based on a digital input signal from a digital source is maintained within the degradation level based on a nonlinear operation of a nonlinear operated single gate oxide device;

including the step of switching to selectively activate the nonlinear device based on a level of the digital input signal; and including the step of controlling a reference voltage controlled switch to limit a voltage level to an output buffer transistor to provide multi-supply voltage level shifting based on the first and second supply voltages.

18. The method of claim 17 including the step of generating a multi-mode control signal to facilitate bypassing of the non-linear device in response to whether the supply voltage is the first or second supply voltage.

* * * * *